(12) United States Patent
Byström et al.

(10) Patent No.: US 10,181,815 B2
(45) Date of Patent: Jan. 15, 2019

(54) RECEIVER FOR PV/T SOLAR ENERGY SYSTEMS

(75) Inventors: Joakim Byström, Härnösand (SE); Johan Nilsson, Härnösand (SE); Olle Olsson, Härnösand (SE)

(73) Assignee: ABSOLICON SOLAR COLLECTOR AB, Harnosand (SE)

(*) Notice: Subject to any disclaimer, the term of this patent is extended or adjusted under 35 U.S.C. 154(b) by 1036 days.

(21) Appl. No.: 13/145,095

(22) PCT Filed: Feb. 12, 2010

(86) PCT No.: PCT/SE2010/050168
§ 371 (c)(1),
(2), (4) Date: Oct. 18, 2011

(87) PCT Pub. No.: WO2010/096001
PCT Pub. Date: Aug. 26, 2010

(65) Prior Publication Data
US 2012/0024346 A1  Feb. 2, 2012

(30) Foreign Application Priority Data

Feb. 17, 2009 (SE) .................................. 0900198

(51) Int. Cl.
*F24S 20/20* (2018.01)
*F24S 20/25* (2018.01)
(Continued)

(52) U.S. Cl.
CPC .............. *H02S 40/44* (2014.12); *F24S 20/20* (2018.05); *F24S 20/25* (2018.05); *F24S 23/74* (2018.05);
(Continued)

(58) Field of Classification Search
CPC ... H01L 31/054; H01L 31/0547; H02S 40/44; H02S 20/00; H02S 20/32; H02S 40/425;
(Continued)

(56) References Cited

U.S. PATENT DOCUMENTS 2,919,298 A    12/1959  Regnier et al.
4,180,414 A *  12/1979  Diamond .............. H01L 31/048
                                                      136/246
(Continued)

FOREIGN PATENT DOCUMENTS

DE    19544627 A1    6/1997
DE    19837189 C1    9/1999
(Continued)

OTHER PUBLICATIONS

Koltun, M.M., "Selective optical surfaces for solar energy converters", New York, Allerton Press, Inc., 1981. 244 p.*
(Continued)

*Primary Examiner* — Tamir Ayad
(74) *Attorney, Agent, or Firm* — Morrison & Foerster LLP

(57) ABSTRACT

The invention relates to a receiver for production of electricity and heat in solar energy systems comprising focussing optical components wherein, the receiver has at least one surface covered with solar cells for production of electricity and at least one optically selective surface, wherein a greater portion of the surface of the receiver exposed to concentrated sunlight is covered with solar cells, while a greater portion of the surface of the receiver exposed to direct sunlight is covered with an optically selective surface.

5 Claims, 3 Drawing Sheets

(51) Int. Cl.
*F24S 23/74* (2018.01)
*H02S 40/42* (2014.01)
*H02S 40/44* (2014.01)
*H01L 31/054* (2014.01)
*H02S 20/00* (2014.01)
*H02S 20/32* (2014.01)

(52) U.S. Cl.
CPC .......... *H01L 31/0547* (2014.12); *H02S 20/00* (2013.01); *H02S 20/32* (2014.12); *H02S 40/425* (2014.12); *Y02E 10/41* (2013.01); *Y02E 10/45* (2013.01); *Y02E 10/52* (2013.01); *Y02E 10/60* (2013.01)

(58) Field of Classification Search
CPC ..... F24J 2/0015; F24J 2/07; F24J 2/14; Y02E 10/41; Y02E 10/45; Y02E 10/52; Y02E 10/60; F24S 20/20; F24S 20/25; F24S 23/74
USPC .......................................................... 136/248
See application file for complete search history.

(56) References Cited

U.S. PATENT DOCUMENTS

| | | | |
|---|---|---|---|
| 4,337,758 A | 7/1982 | Meinel et al. | |
| 4,388,481 A | 6/1983 | Uroshevich | |
| 4,491,681 A * | 1/1985 | Kirpich | F24J 2/07 136/244 |
| 5,154,777 A | 10/1992 | Blackmon et al. | |
| 5,167,218 A * | 12/1992 | Deakin | F24J 2/0488 126/569 |
| 5,269,851 A | 12/1993 | Horne | |
| 6,207,299 B1 * | 3/2001 | Krauth | C23C 2/12 428/653 |
| 7,343,913 B2 * | 3/2008 | Niedermeyer | F24J 2/055 126/605 |
| 2007/0227573 A1 * | 10/2007 | Hunter et al. | 136/206 |
| 2008/0000516 A1 | 1/2008 | Shifman | |
| 2008/0190476 A1 * | 8/2008 | Baruh | B63H 9/04 136/245 |

FOREIGN PATENT DOCUMENTS

JP 54-63439 A 5/1979
WO 2005/090873 A1 9/2005

OTHER PUBLICATIONS

Agnihotri, O.P.; Gupta, B.K., "Solar selective surfaces", New York, Wiley-Interscience, 1981, 232 p.*
International Search Report received for PCT Patent Application No. PCT/SE2010/050168, dated May 24, 2010, 5 pages.
Extended European Search Report dated Dec. 9, 2013, directed to EP 10 744 019.0; 8 pages.
Communication pursuant to Article 94(3) EPC dated Jul. 7, 2017, directed EP 10 744 019.0; 6 pages.
Choudhury, G.M. (Jul. 2000-Dec. 2002). "Selective Surface for efficient Solar Thermal Conversion," *Bangladesh Renewable Energy Newsletter*, vol. 1, No. 2, vols. 2 & 3: pp. 1-3.

* cited by examiner

RECEIVER FOR PV/T SOLAR ENERGY SYSTEMS

CROSS REFERENCE TO RELATED APPLICATIONS

This is a U.S. National Phase patent application of PCT/SE2010/050168, filed Feb. 12, 2010, which claims priority to Swedish Patent Application No. 0900198-3, filed Feb. 17, 2009, each of which is hereby incorporated by reference in the present disclosure in its entirety.

TECHNICAL BACKGROUND

A rapid development is currently occurring in the field of solar energy. The technological development encompasses a multitude of different areas within the field of solar energy, from simple flat thermal solar collectors for water heating in swimming pools to advanced solar cell systems that by concentrating the sunlight by a thousand times converts sunlight to electricity with an efficiency of over 30%.

In concentrating solar energy systems sunlight is focussed using different optical systems such as reflectors or lenses onto a receiver, in which the concentrated sunlight is converted into other forms of energy, for instance electricity or heat.

One type of concentrating solar energy systems is parabolic troughs where the sunlight is concentrated into a longitudinal line. An example is the 84 m long and 6 m wide Euclides at ITER on Tenerife, that converts sunlight to electricity, and the "Parabolrinnen" by the German company Solar Millennium AG, that heats oil to 400° C.

A concentrating solar energy system comprises a number of components, optical components for concentrating the light, components for continuously tracking the sun, receivers for receiving the concentrated solar radiation, and different kinds of ancillary equipment, such as turbines or hot water heaters.

A particular type of receiver is provided with solar cells in order to allow combined production of electricity and heat. The technology is termed PV/T (photovoltaic/thermal) and examples can be found under the trademark "Double Solar" from Absolicon Solar Concentrator AB and from the companies Menova and Heliodynamics.

A problem with receivers for combined production of electricity and heat is the combination of high production of electricity and high production of heat. Traditionally, it has been attempted to reduce heat losses by insulating the receiver.

One example of a traditional PV/T receiver is disclosed in U.S. Pat. No. 4,491,681. The receiver is filled with insulating material in order to keep heat losses low.

In solar energy systems possible solutions must be very cost effective in order to allow solar power to compete with other sources of energy.

Hence, there is a need for providing a receiver which is simple and inexpensive to manufacture, in spite of having both solar cells and a high exchange of heat.

SUMMARY OF INVENTION

The object of the invention is to provide a receiver which has a high heat exchange and is simple and inexpensive to manufacture.

According to the invention, this object is achieved by a receiver for production of electricity and heat in solar energy systems comprising focussing optical components, characterized in that the receiver has at least one surface covered with solar cells for production of electricity and at least one optically selective surface, wherein a greater portion of the surface of the receiver exposed to concentrated sunlight is covered with solar cells, while a greater portion of the surface of the receiver exposed to direct sunlight is covered with an optically selective surface.

According to one alternative, the receiver is assembled from at least one component provided with solar cells and at least one component provided with a selective surface.

The at least one component that is provided with a selective surface may be manufactured from a thin metal sheet.

According to a further alternative, the receiver comprises two solar cell modules and the component with a selective surface is shaped so that it blocks convection in the gap between the solar cell modules.

The invention also relates to a solar energy system comprising a receiver described above, characterized in that the solar energy system comprises an extended parabolic reflector trough with a linear focus, where the receiver is arranged in the longitudinal direction of the trough.

The solar energy system may comprise a mechanism for solar tracking.

The invention further relates to the use of a receiver described above for generating solar heat and electricity.

DESCRIPTION OF THE INVENTION

The purpose of the current invention is to increase the exchange of heat from a PV/T receiver and simultaneously reduce the manufacturing costs.

The invention involves a PV/T (photovoltaic/thermal) receiver in solar energy systems which are simpler to manufacture and have a higher thermal efficiency. This is achieved by using a combination of solar cells and optically selective surfaces in a concentration solar power system.

In this application the term selective surface refers to a surface with the optical property of absorbing visible light and appearing dark to the eye, but which reflects light in the infrared portion of the light spectrum. A selective surface has a high optical absorbance/emittance in the visible spectrum and a lower absorbance/emittance in the infrared spectrum.

This property entails that the energy supplied to the selective surface by solar incident radiation is only lost to a small extent through radiation, but is mainly lost through flow or conduction. If these mechanisms, i.e. energy losses through flow or conduction, are also suppressed and the selective surface is exposed to direct sunlight the selective surface will assume a thermal balance between incident energy and losses at a temperature considerably above the ambient temperature, typically 50-200° C. above the ambient temperature.

Because the selective surface in the trough will assume a temperature approximately equal to or higher than that of the heat carrier used for transporting the heat exchange, the need for insulating those components of the receiver exposed to direct sunlight is eliminated. Furthermore, if the temperature of the selective surface is higher than the temperature in the receiver, heat is conducted from the selective surface to the fluid flowing in the receiver. In this case the selective surface contributes to the heat production of the solar energy system.

In a construction where the entire receiver is exposed to sunlight, it is thus possible to eliminate all insulation.

One example of such a construction is a triangular receiver (FIG. 3) placed in a parabolic trough where the sides are exposed to concentrated light and the upper side to direct sunlight. (In this application, the upper side of the receiver is the part of the receiver facing the sun.)

By direct sunlight is meant sunlight directly from the sun, without concentration, that is normally 1000 W/m². In the reflector trough in FIG. 2 which is coated with a reflective film 3 the light is concentrated to the sides of the reflector as illustrated by the sunrays a-c, while the cover on the upper surface of the reflector is only exposed to direct sunlight from the sunray d and the bottom portion 5 is only exposed to scattered light from the reflector.

Such a receiver (FIG. 3) can be manufactured in one piece from a triangular profile, wherein the solar cells 10-11 are mounted on the sides and where the upper surface is provided with a selective surface 12.

The invention leads to two important advantages.

The heat exchange from the receiver increases, which increases the value of the product.

The receiver does not require any insulation.

Not needing the insulation is a technical advantage. Often glass wool is used which loses its insulating properties if it gets wet. The insulation is also comparatively difficult to handle in a production process, and the receiver will become unnecessarily large.

According to one variation of the invention the receiver is manufactured in multiple components. Preferably, the components comprise at least one solar cell module and at least one component provided with a selective surface. The solar cell module comprises the solar cells and can also comprise a channel for a heat medium. The component with a selective surface, here termed cover, may comprise a thin sheet metal having a selective surface.

Preferably, the receiver is assembled from at least one component provided with solar cells, such as a solar cell module and at least one component provided with a selective surface, such as a cover, and possibly other components.

This results in additional positive effects for the solar energy system.

The two complex manufacturing steps are divided onto two separate components; the solar cells are applied to one and the selective surface to the other. This may reduce the manufacturing costs, for instance by using mass produced sheet metal with a selective surface.

The component with the selective surface can easily be replaced if necessary, for instance if the selective surface loses its function over time.

In the case of an extended, triangular receiver it is possible to use two solar cell modules on each receiver, one for each side. This facilitates production, because solar cells are only mounted on one side of the solar cell module.

By using two solar cell modules the channels for the heat carrier can be connected at the remote end. The heat carrier will then go out through one solar cell module and returns in the other. This means that the receiver connections for feeding the heat carrier to and from the receiver, respectively, can be made at the same end, which reduces the amount of tubing in the solar energy system.

In the case of one receiver with two solar cell modules (FIG. 5), one for each side, where the component with a selective surface is arranged as a cover 17 on top of the solar cell modules, the cover can reduce the thermal convection losses, because the cover blocks the convection in the gap 21 between the solar cell modules.

The invention is intended for parabolic troughs but can also be applied to other types of optics for concentrating solar energy systems combining production of electricity with solar cells and solar heat. The concentrating solar energy systems may be fixed or be provided with a mechanism for tracking the sun, either daily or by re-adjusting for different times of the year.

EMBODIMENTS OF THE INVENTION

The present invention will now be described with reference to the accompanying drawing figures, which are intended for illustrative purposes only.

Figure 1:
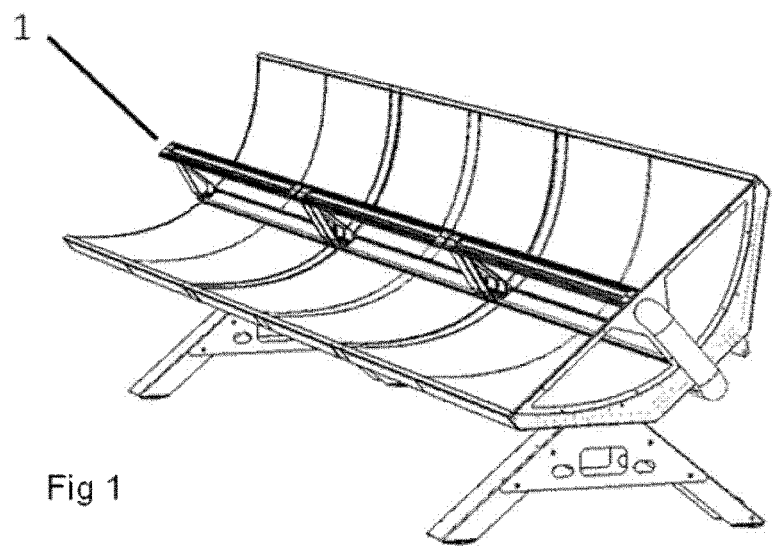
FIG. 1 shows a perspective view of a solar energy system in the form of a parabolic trough.

A solar energy system of the parabolic trough type is depicted in FIG. 1. The trough can be approximately one metre wide and approximately six metres long.

The term parabolic trough refers to a trough essentially shaped as a truncated two-dimensional parabolid extended into a half-cylindrical pipe.

On the rear side of the trough there are provided two linear adjusting means (not shown in the picture) which are used for turning the trough towards the sun so that the receiver 1 is placed in focus. The solar tracking mechanism is automatic and computer controlled by time and date, but may also use sensors for sensing the position of the sun in the sky.

In some embodiments, (see FIG. 2) the front of the trough is covered by a transparent covering sheet 2 made from e.g. glass or a transparent plastic that encloses the reflector in order to protect the reflector sheet or to increase the stiffness of the trough. The covering sheet may reduce the convection from the receiver and prevent wind from causing a forced convection—both effects contributes to the reduction of heat losses from the receiver.

Figure 2:
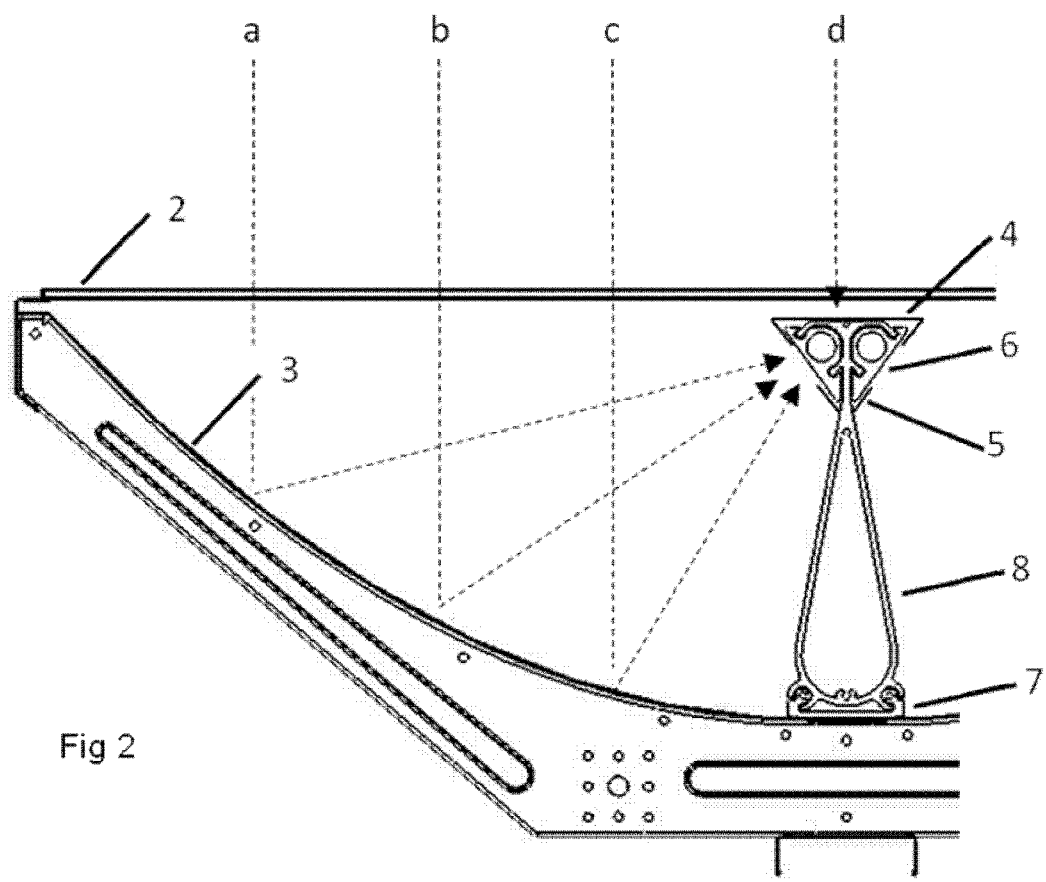
FIG. 2 shows a cross-sectional view of a trough with a receiver.

FIG. 2 shows a cross-section through the trough with the receiver mounted in place. The reflector sheet may be a 0.7 mm steel sheet coated with for instance a silver film. The reflector sheet 3 focuses the light onto a receiver (also termed absorber) having a cover 4 and a bottom portion 5, with solar cells arranged on its sides 6.

An attachment 7 is arranged on the surface of the reflector, wherein a holder 8 for holding the receiver in place extends from said attachment.

The receiver shown in FIG. 2 has a triangular cross-section, which gives a good absorption of the light rays reflected from the surface of the reflector inwards to the solar cells of the receiver. The receiver may also have other cross-sections which makes it possible to absorb light rays from the surface of the reflector.

Consequently, the described receiver is intended for combined production of electricity and heat where solar cells for concentrated light are mounted on the receiver. A heat carrier for cooling the solar cells and extracting heat from the system flows through channels in the receiver. The heat can be used for e.g. heating hot water in a building.

Figure 3:
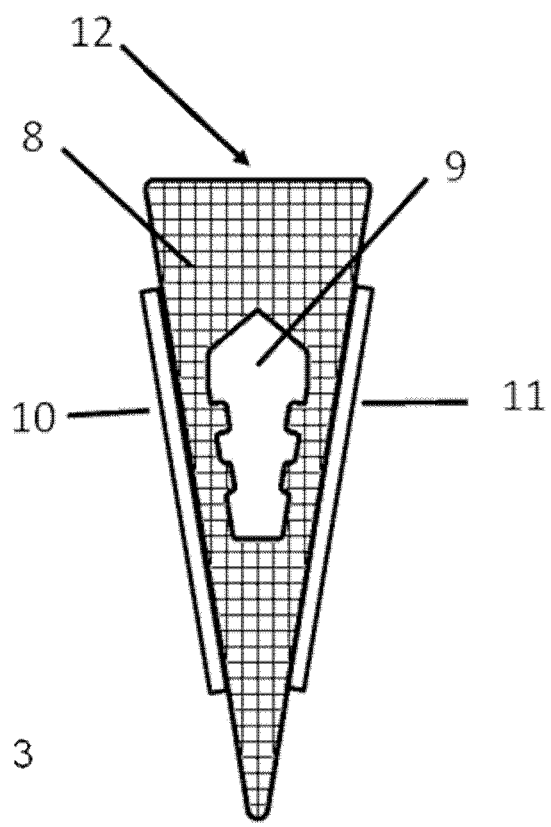
FIG. 3 shows a cross-sectional view of a receiver made in one piece.

In order to manufacture a receiver according to FIG. 2 having both solar cells and a selective surface, it is possible to start from a triangular profile 8 (see FIG. 3) of a material that is suited for coating with a selective surface, for instance, extruded aluminium or copper. A channel 9 for the heat carrier can also be included in the profile. The channel can be provided with fins in order to increase the heat transfer to the heat carrier. On this profile, solar cells 10 and 11 are laminated onto the two sides which are hit by the concentrated light from the reflector. The surface on the upper side 12 is treated to provide a selective surface.

A selective surface can be created in many different ways. A common method in the field of solar panels is to start from an aluminium sheet that is treated with acid, anodised and coloured with inter alia nickel particles. It is further possible to sputter a thin metal layer onto a sheet of aluminium or copper. There is also paint, such as Solkote™, that can be spray painted onto bright metal surfaces.

Figure 4:
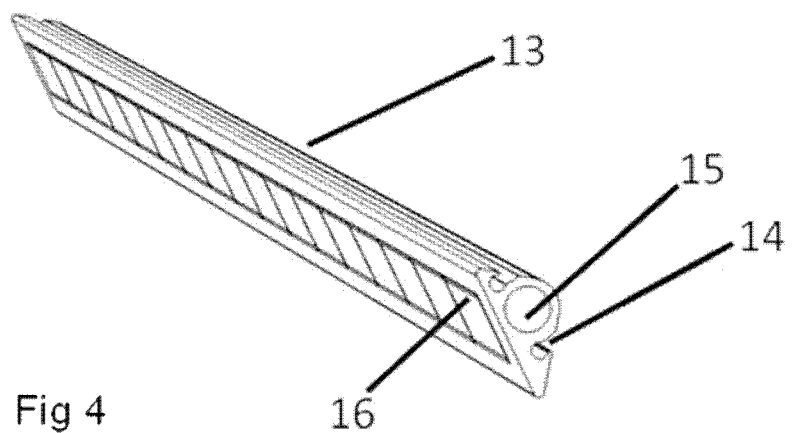
FIG. 4 shows a perspective view of a solar cell module.

For manufacturing reasons the receiver can also comprise several components. The receiver can comprise two solar cell modules (FIG. 4) where the solar cells 16 are mounted on triangular elements 13 having longitudinal slots 14 for attaching holders 8 and through holes or channels 15 for a heat carrier.

The triangular elements can be manufactured by extrusion, which results in an efficient production. A suitable material is extruded aluminium, which gives high strength and low weight. An alternative to aluminium is plastic.

Figure 5:
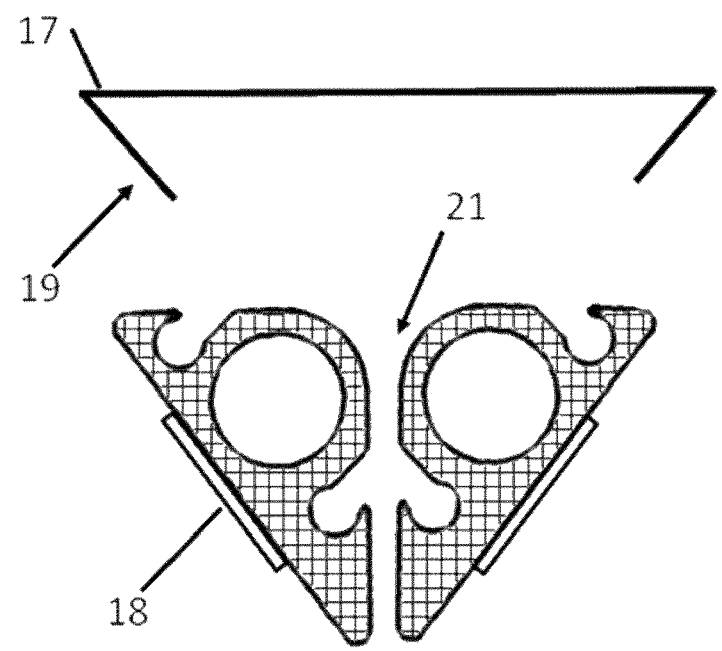
FIG. 5 shows a cross-sectional view of components for the receiver.

FIG. 5 illustrates a receiver manufactured from several components. A cover 17 with a selective surface is mounted so that the upper portions of the receiver not covered by solar cells are enclosed.

If the edges 19 are folded down over the sides of the upper portion of the receiver then they can have the function of holding the cover in place. The solar cells 18 do not extend all the way to the edge of the sides, so that the folded edges do not block the portion of the surface that generates electricity, but only contributes to an increase of the heat exchange.

The cover can be made from a metal sheet, for instance of aluminium or copper, where the surface has been treated so that it is optically selective.

The metal sheet is worked, for instance by bending or roll forming, so that it is formed around the receiver.

The underside of the receiver can be covered by a bottom portion (20), which can be manufactured in the same way as the cover.

The cover and/or bottom portion also contributes to increased heat production by blocking the gap 21 between the two solar cell modules which would otherwise result in heat losses.

If the equilibrium temperature of the cover and/or the bottom portion is judged to be than the temperature of the heat carrier it is an advantage for the heat production if they are brought into good thermal contact with the solar cell module and consequently with the heat carrier.

Figure 6:
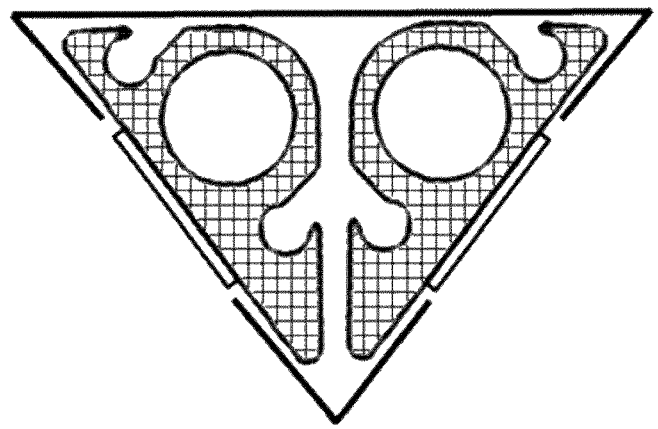
FIG. 6 shows a cross-sectional view of an assembled receiver.

FIG. 6 shows a complete receiver assembled from the components solar cell modules, cover and bottom portion, which can be attached to a carriage and mounted in the trough of a solar collector.

The cover can be mounted on the solar cell modules by using the flanges of the cover for holding it in place, but the cover and bottom portion can also be mounted by means of e.g. adhesives, tape or be attached in grooves or ears.

The greater portion of the receiver will therefore be covered by two types of surfaces having optically different properties. One type comprises solar cells and the other type of surface has an optically selective coating for absorbing sunlight and minimise emission of heat.

The invention claimed is:

1. A receiver for production of electricity and heat in solar energy systems, the receiver comprising:
   an elongated body having a triangular cross-section and having a first elongated side surface, a second elongated side surface and a third elongated side surface;
   solar cells covering the first and third elongated surfaces;
   an optically selective surface formed on a metal sheet and covering the second elongated side surface; and
   a channel for a heat carrier formed in the elongated body,
   wherein the optically selective surface has a high optical absorbance/emittance in a visible spectrum range and a low optical absorbance/emittance in an infrared spectrum range, the high optical absorbance/emittance being higher than the low optical absorbance/emittance,
   a majority portion of the first elongated side surface of the receiver is covered with the solar cells, a majority portion of the second elongated side surface of the receiver is covered with the optically selective surface, and a majority portion of the third elongated side surface of the receiver is covered with the solar cells,
   the channel occupies an inside portion of the elongated body in the triangular cross-section thereof,
   the receiver is configured to increase the production of heat, and
   the receiver contains no thermal insulation.

2. A solar energy system comprising a receiver according to claim 1, wherein the solar energy system comprises an extended parabolic reflector trough with a linear focus, wherein the receiver is arranged in a longitudinal direction of the trough.

3. A solar energy system according to claim 2, wherein the solar energy system comprises a mechanism for solar tracking.

4. A method for generating solar heat and electricity, the method comprising:
   generating solar heat and electricity using the receiver according to claim 1.

5. A receiver for production of electricity and heat in solar energy systems in an extended parabolic reflector trough with a linear focus and a mechanism for solar tracking, wherein the receiver is arranged in a longitudinal direction of the trough, and the receiver has an elongated body having a triangular cross-section with at least one channel for a heat carrier,
   wherein the surface of the receiver has solar cells on a greater portion of the surface of the receiver exposed to concentrated sunlight reflected by the parabolic trough, and
   the surface of the receiver is an optically selective surface on a greater portion of the surface of the receiver exposed to direct sunlight,
   the optically selective surface having a high optical absorbance/emittance in a visible spectrum range and a low optical absorbance/emittance in an infrared spectrum range, and the high optical absorbance/emittance being higher than the low optical absorbance/emittance, and
   wherein the at least one channel occupies an inside portion of the elongated body in the triangular cross-section thereof, and
   the receiver contains no thermal insulation.

* * * * *